United States Patent
Yamada

(10) Patent No.: US 7,574,275 B2
(45) Date of Patent: Aug. 11, 2009

(54) RECORDING APPARATUS, REPRODUCING APPARATUS, AND RECORDING AND/OR REPRODUCING APPARATUS

(75) Inventor: Eiichi Yamada, Tokyo (JP)

(73) Assignee: Sony Corporation (JP)

( * ) Notice: Subject to any disclaimer, the term of this patent is extended or adjusted under 35 U.S.C. 154(b) by 1048 days.

(21) Appl. No.: 11/092,940

(22) Filed: Mar. 28, 2005

(65) Prior Publication Data

US 2005/0171764 A1  Aug. 4, 2005

Related U.S. Application Data

(60) Continuation of application No. 09/670,871, filed on Sep. 27, 2000, now Pat. No. 6,925,341, which is a division of application No. 08/925,126, filed on Sep. 8, 1997, now Pat. No. 6,311,092.

(30) Foreign Application Priority Data

Sep. 18, 1996 (JP) ............................. P08-246684

(51) Int. Cl.
*G06F 17/00* (2006.01)
*G10L 11/00* (2006.01)
(52) U.S. Cl. ..................... 700/94; 381/61; 704/270; 704/278
(58) Field of Classification Search ............ 700/94; 381/61, 124; 704/270, 272, 278; 369/63, 369/31.01; 360/32, 55, 57; 340/692, 384.7
See application file for complete search history.

(56) References Cited

U.S. PATENT DOCUMENTS

| | | | |
|---|---|---|---|
| 4,460,928 A | 7/1984 | Kishimoto | |
| 4,502,788 A | 3/1985 | Lowden | |
| 4,791,741 A | 12/1988 | Kondo | |
| 4,814,905 A | 3/1989 | Hashimoto | |
| 5,045,327 A | 9/1991 | Tarlow et al. | |
| 5,161,070 A | 11/1992 | Muramoto et al. | |
| 5,359,698 A | 10/1994 | Goldberg et al. | |
| 5,402,518 A | 3/1995 | Lowery | |
| 5,499,316 A | 3/1996 | Sudoh et al. | |
| 5,774,863 A | 6/1998 | Okano et al. | |
| 5,787,399 A | 7/1998 | Lee et al. | |
| 5,903,868 A | 5/1999 | Yuen et al. | |
| 5,903,871 A | 5/1999 | Terui et al. | |
| 6,055,500 A | 4/2000 | Terui et al. | |
| 6,289,253 B1 | 9/2001 | Iida | |
| 6,925,341 B1 | 8/2005 | Yamada | |

(Continued)

*Primary Examiner*—Xu Mei
(74) *Attorney, Agent, or Firm*—Lerner, David, Littenberg, Krumholz & Mentlik, LLP

(57) ABSTRACT

The present invention provides an apparatus having a microphone, an analog to digital converting circuit, a semiconductor memory, input device, and a controller. The analog to digital converting circuit converts an output signal from the microphone into a digital signal. The semiconductor memory stores the output signal from the analog to digital converting circuit. The input device at least carry out input of a record start and a record end. The controller, according to the input from the input device, carries out operation control for start and stop of writing into the semiconductor memory a digital signal from the analog to digital converting circuit. When the input device is operated and a predetermined time interval has passed, the controller controls to start writing the digital signal from the analog/digital conversion circuit into the semiconductor memory.

1 Claim, 6 Drawing Sheets

U.S. PATENT DOCUMENTS 7,103,430 B2 * 9/2006 Yamada ..................... 700/94
7,228,188 B1 * 6/2007 Aihara et al. ................ 700/94
7,415,314 B2 * 8/2008 Yamada ..................... 700/94

* cited by examiner

RECORDING APPARATUS, REPRODUCING APPARATUS, AND RECORDING AND/OR REPRODUCING APPARATUS

This application is a continuation of application Ser. No. 09/670,871, filed Sep. 27, 2000, now U.S. Pat. No. 6,925,341, which is a division of application Ser. No. 08/925,126, filed Sep. 8, 1997, now U.S. Pat. No. 6,311,092.

BACKGROUND OF THE INVENTION

1. Field of the Invention

The present invention relates to a recording apparatus, a reproducing apparatus, and a recording and/or reproducing apparatus, and particularly to a recording apparatus, a reproducing apparatus, and a recording and/or reproducing apparatus having a storage device.

2. Prior Art

A voice signal recording apparatus such as a portable, small-size tape recorder and an optical magnetic disc apparatus capable of writing normally has a built-in microphone for recording, in a cabinet thereof. The cabinet also has operation pushbutton switches such as a recording start pushbutton switch and a stop pushbutton switch.

These pushbutton switches are usually provided with a click mechanism so that a user can feel when a pushbutton switch is depressed, which assures the operation.

The above-mentioned small-size voice signal recording apparatus has a problem that a click sound is also recorded because it is impossible to assure a sufficient distance between a microphone and, for example, a recording start pushbutton switch.

FIG. 1(A) through FIG. 1(F) shows a concrete example. If a recording start pushbutton switch is depressed at time $t_1$ and released at time $t_2$ as shown in FIG. 1(A), and a stop pushbutton switch is depressed at time $t_3$ and released at time $t_4$ as shown in FIG. 1(B), then, as shown in FIG. 1(C), a voice is generated at each of these operations. The voices have the maximum amplitude at $t_1$, $t_2$, $t_3$, and $t_4$, respectively and the amplitude is gradually attenuated for a time interval T. Consequently, as shown in FIG. 1(f), the click sounds are inputted over a voice to be recorded. On the other hand, as shown in FIG. 1(E), recording starts with a delay of $\Delta 1$ after time $t_1$ when the recording start pushbutton switch is specified, and the recording terminates with a delay of $\Delta 2$ after time $t_3$ when the recording stop pushbutton switch is specified. That is, as shown in FIG. 1(F), three click voices are recorded over a voice to be recorded.

Thus, a small-size voice signal recording apparatus having a built-in microphone has a problem that if a pushbutton switch provided with a click mechanism is used for improving operation feeling for a user, the click sound of the pushbutton switch is also unnecessarily recorded.

SUMMARY OF THE INVENTION

It is therefore an object of the present invention to provide a recording apparatus which resolves the above-mentioned problem.

It is another object of the present invention to provide a reproducing apparatus which resolves the above-mentioned problem.

It is a further object of the present invention to provide a recording and/or reproducing apparatus which resolves the above-mentioned problem.

According to the present invention, there is provided a recording apparatus including a microphone, an analog to digital converting circuit, a storage device, an input device, and a controller. The analog to digital converting circuit converts an output signal from the microphone, into a digital signal. An output signal from this analog to digital converting circuit is written in the storage device. The input device is capable of entering at least a recording start and recording stop. The controller, according to the operation of the input device, controls start and stop of writing into the storage device a digital signal produced from the analog to digital converting circuit. The controller controls so as to start writing into the storage device the digital signal from the analog to digital converting circuit when a predetermined time interval has passed after the input device is operated.

According to the present invention, there is provided a reproducing apparatus including a storage device, time setter, a memory, and a controller. At least one dynamic data is written into the storage device. The time setter is used for specifying a time. The memory stores a time data specified by the time setter. The controller reads out the dynamic data from the storage device according to the time data stored in the memory.

According to the present invention, there is provided a recording and/or reproducing apparatus including a microphone, an analog to digital converting circuit, a semiconductor memory, a digital to analog converting circuit, an input device, a controller, and a cabinet. The analog to digital converting circuit converts an output signal from the microphone, into a digital signal. The semiconductor memory stores an output signal from the analog to digital converting circuit. A digital signal read from the semiconductor memory is converted into an analog signal by the digital to analog converting circuit. The input device at least enters a recording start, recording stop, and reproduction start. The controller, according to an operation of the input device, controls writing of a digital signal from the analog to digital converting circuit, into the semiconductor memory, and reading of a digital signal from the semiconductor memory. The cabinet is provided with the microphone, the analog to digital converting circuit, the digital to analog converting circuit, and the input device.

DETAILED DESCRIPTION OF THE INVENTION

Hereinafter, a recording and/or reproducing apparatus according to the present invention will be explained in detail with reference to the attached drawings. The recording and/or reproducing apparatus will be explained as a recording/reproducing apparatus (hereinafter, referred to as an IC recorder) in which a signal from a-microphone is stored in a semiconductor memory, and a signal read from the semiconductor memory is outputted from a speaker.

Figure 1:
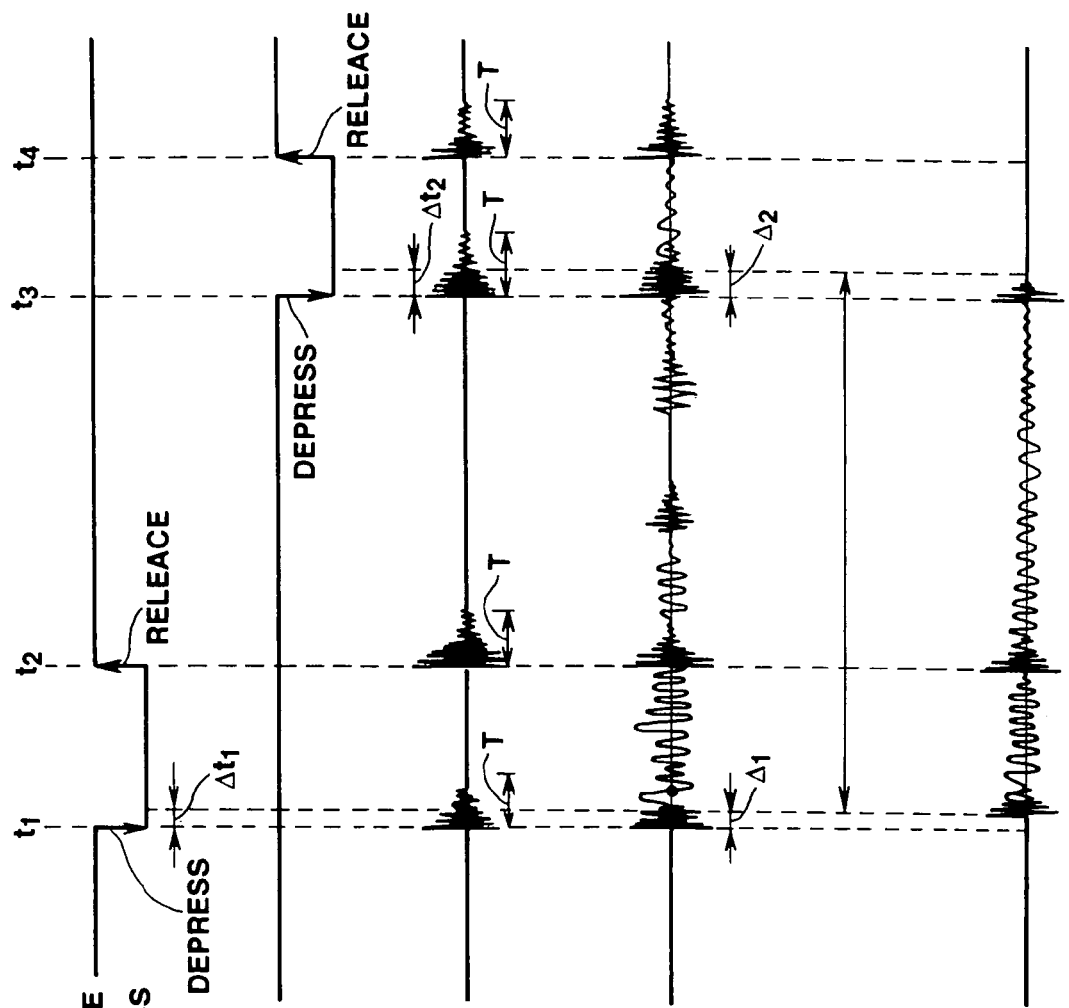
FIG. 1(A) to (F) are to be used to explain the relationship between a click sound generated when a recording start pushbutton or a recording stop pushbutton is depressed and a result of recording.
Figure 2:
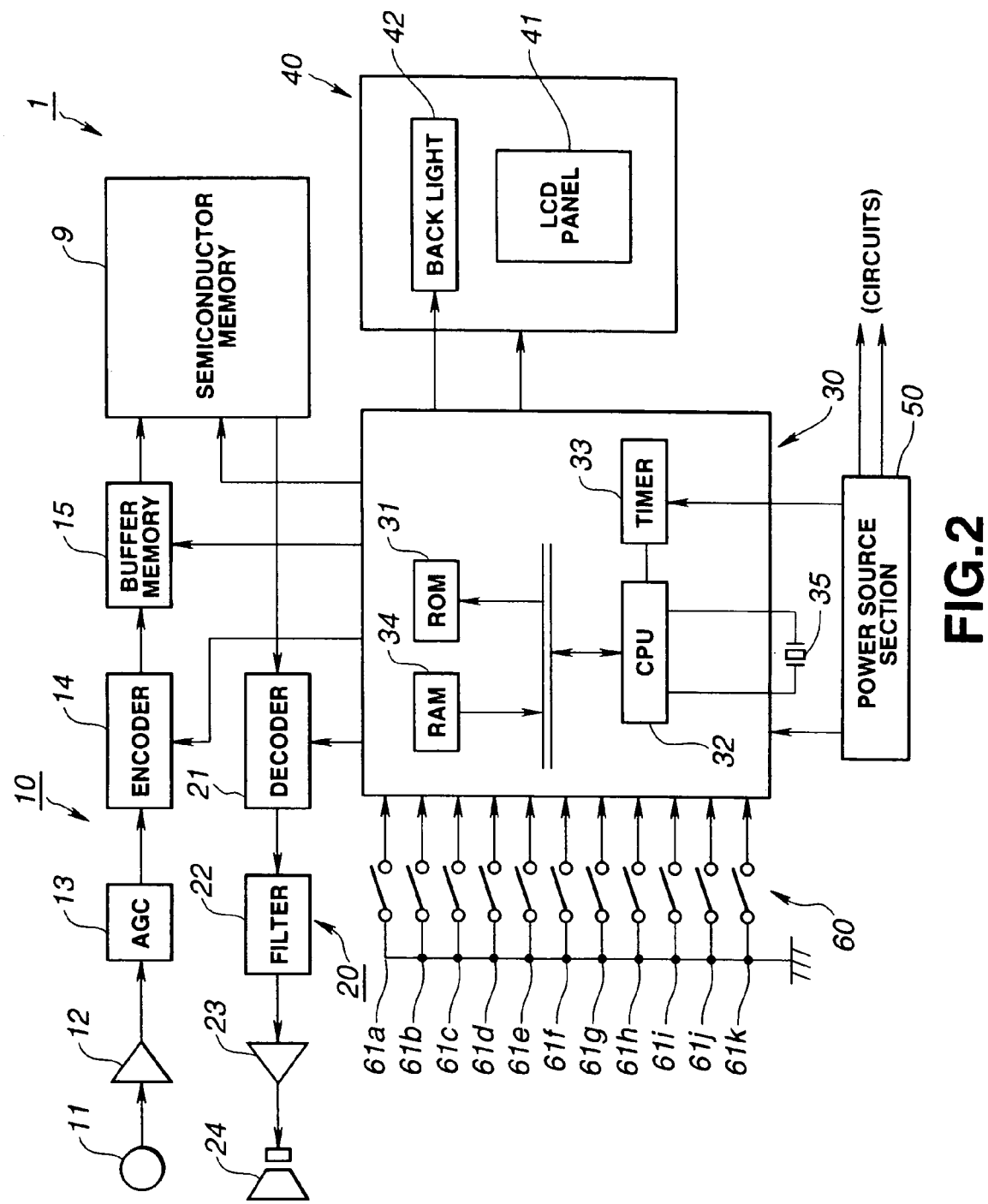
FIG. 2 is a block diagram showing a configuration of an IC recorder as a recording and/or reproducing apparatus according to an embodiment of the present invention.

As shown in FIG. 2, for example, the IC recorder 1 has:
a recording section 10 which converts a voice signal from a microphone 11, into a voice data, and stores it in a semiconductor memory 9;
a reproducing section 20 which reads out the voice data from the semiconductor memory 9 converts it into a voice signal, and drives a speaker 24;
a controller 30 which controls the recording section 10;
a display section 40 which displays an operation state and an operation procedure;
a power source 50 for supplying power to the controller 30 and others; and
an input device 60 for a user to carry out operations.

The recording section 10, as shown in FIG. 2, has: an amplifier 12 for amplifying a voice signal from the microphone 11; a automatic gain controller 13 (hereinafter, referred to as AGC) for adjusting the voice signal amplified by the amplifier 12 to be at a proper level; an encoder 14 for converting a voice signal from the AGC 13 into a voice data; and a buffer memory 15 for delaying the voice data from the encoder 14.

A voice entered to the microphone 11 is converted into a voice signal by the microphone 11 and supplied to the amplifier 12. The amplifier 12 amplifies the voice signal and supplies a resultant signal to the AGC 13. The voice signal which has been amplified by the amplifier 12 is further amplified by the AGC so as to obtain an appropriate level, which is then supplied to the encoder 14.

Because a voice signal has an intimate correlation with time the encoder 14, for example by way of adaptive differential pulse code modulation (hereinafter, referred to ADPCM), encodes a voice signal with a small amount of data so as to generate a voice data, which is supplied to the buffer memory 15.

The buffer memory has a capacity sufficient to store the voice data from the encoder 14 for a predetermined time interval, and temporarily stores the voice data from the encoder 14 and then supplies the data to the semiconductor memory 9.

The semiconductor memory 9 is made of an involatile memory in which contents of a storage device will be held without disappearing even if a power source of a memory, for example, electrical erasable/programmable read-only memory (hereinafter, referred to as EEPROM), is turned off. The semiconductor memory stores the voice data supplied from the buffer memory 15 as well as a control data (hereinafter, referred to as TOC data) which controls a voice data, by indicating in which area the voice data is stored. For example, the semiconductor memory 9 has a storage capacity of 16 M bytes and can store for 8 minutes a voice data corresponding to a voice signal of 200 to 3400 Hz at an SP mode which will be explained later, and for 16 minutes a voice data corresponding to a voice signal of 200 to 1700 Hz at an LP mode which will be explained later.

On the other hand, the reproduction section 20, as shown in FIG. 2, includes: a decoder 21 for converting the voice data from the semiconductor memory 9, into a voice signal; a filter 22; and an amplifier 23 which amplifies the voice signal from the filter 22 and supplies the signal to a speaker 24.

The decoder corresponds to the encoder 14 of the recording section 10. The voice data which has been read out of the semiconductor memory 9, i.e., the voice data which has been encoded by the ADPCM method is decoded by this decoder so as to generate a so-called PAM signal. The filter 22 eliminates a high frequency component exceeding a voice zone from this PAM signal, and outputs a voice signal. The signal from the decoder 21 is supplied to the amplifier 23, which amplifies the voice signal and drives the speaker 24. The voice which has been recorded is outputted from the speaker 24.

The controller 30, as shown in FIG. 2, includes: a ROM 31 which stores a program used for controlling operation of the IC recorder; a microcomputer (hereinafter, referred to as CPU) which executes the-program stored in the ROM 31 for controlling the semiconductor memory 9 and the recording section 9; a timer 33 for time count; and a random access memory 34 (hereinafter, referred to as RAM) which temporarily stores a time, a result of program execution or the like.

The controller is supplied with signals from various pushbuttons 61 arranged in the input device 60. When one of the pushbuttons 61 is depressed, the CPU 32 reads out a corresponding program from the ROM 31 and executes the program for controlling a necessary section. For example, if a recording start pushbutton 61k which will be detailed later is depressed, the CPU 32 reads out a program corresponding to recording from the ROM 31 and executes the program so as to operate the amplifier 12, the AGC 13, and the encoder 14. The voice data temporarily stored in the buffer memory 15 is stored in an empty storage area of the semiconductor memory 9. The controller 30 controls writing and reading of a voice data to/from the semiconductor memory 9. Up to 99 cases of voice data can be written into each of two files A and B, each case being identified with an index number. According to an index number, a voice data is read out, or a voice data can also be read out when a specified time has come. This will be detailed later. The CPU 32 is connected to a quartz oscillator 35 for operating the timer 33. As will be detailed later, a voice data stored in the semiconductor memory 9 is read out at a predetermined time. This is also controlled by the CPU 32. The controller 30 is connected to a display section 40, and the CPU 32 displays various information such as an operation state and operation procedure of the IC recorder 1, on the display section 40. The display section 40 includes a liquid crystal display (hereinafter, referred to as LCD) panel 41 and a back light 42 for illuminating this LCD panel. For example, when a menu/feed pushbutton 61s of the input device 60 is depressed, the CPU 32 successively displays a date and a time on the display section 40 so that the user can set the timer, looking at this display.

Figure 3:
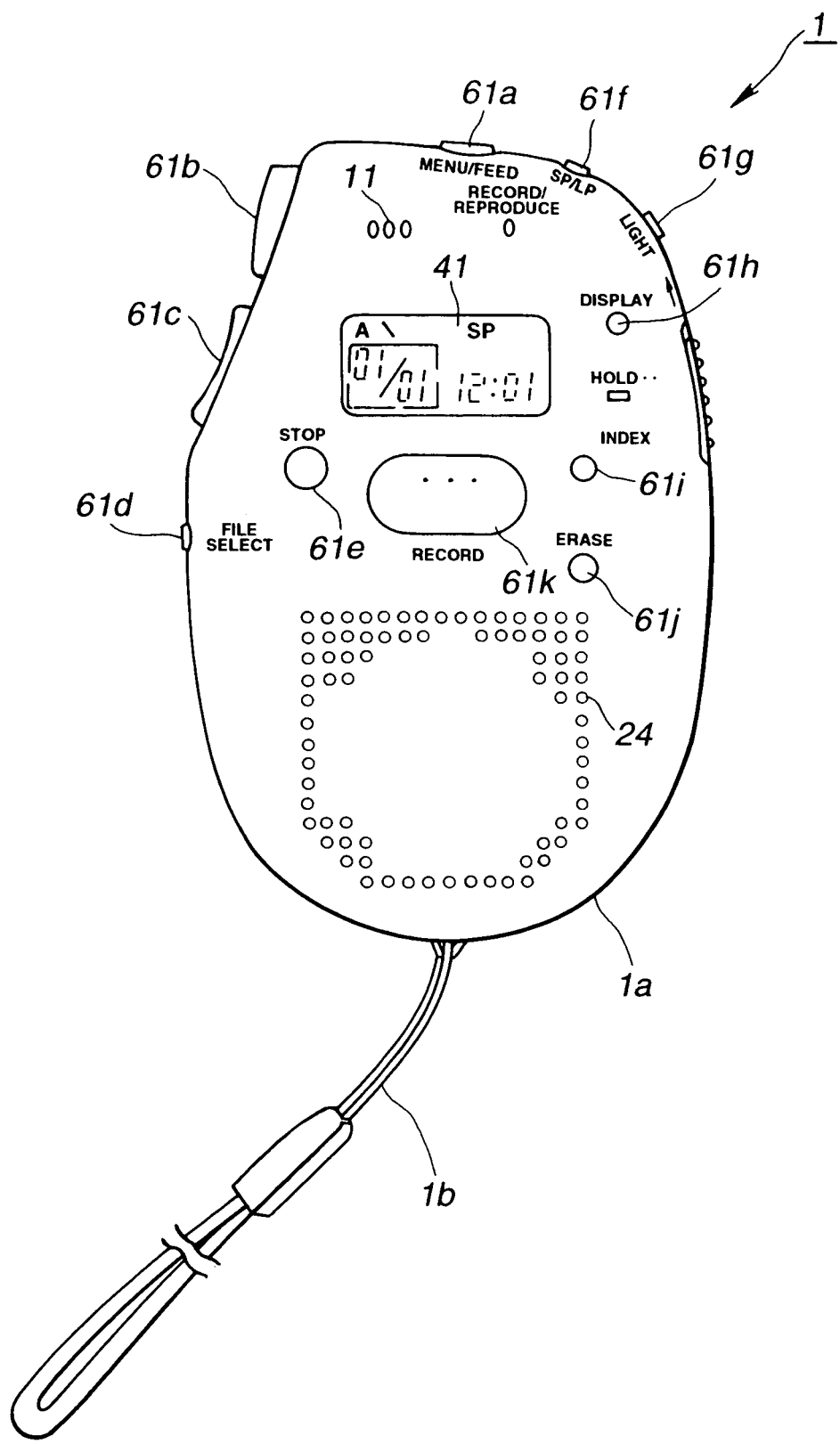
FIG. 3 is a front external view of the IC recorder according to the embodiment.

Description will now be directed a configuration of the input device 60 with reference to FIGS. 2 and 3. FIG. 3 shows a portable IC recorder having an external cabinet formed in size of a palm. The cabinet contains a printed circuit board of the aforementioned recording section 10, the reproduction section 20 or the like. This IC recorder 1 is formed in such a manner that it can easily be held by a left hand of a user so that the user can operate this IC recorder simultaneously with a writing work by the right hand. The IC recorder 1 has an external cabinet 1a, where pushbuttons 61 of the input section 60 are arranged. As shown in FIG. 3, the external cabinet 1a is provided with a hand strap 1b which is used by the user when the user carry the IC recorder 1.

The input section is composed of the following pushbuttons: the menu/feed pushbutton 61a, a reproduction pushbutton 61b for starting a reproduction, a return/feed pushbutton 61c for setting an index number, a file select pushbutton 61 for switching between the aforementioned two files A and B, a stop pushbutton 61e for terminating recording or the like, an SP/LP pushbutton 61f for switching between an SP mode and an LP mode, a light pushbutton 61g for turning the back light 42 on, a display pushbutton 61h, an index pushbutton 61i for setting an index, an erase pushbutton 61j for erasing a voice data stored in the semiconductor memory 9, and a recording start pushbutton 61k for starting a recording. Among these pushbuttons, those which are used most frequently, i.e., the reproduction pushbutton 61b and the return/feed pushbutton 61c are arranged in the notched portion of a side surface at the upper left of the external cabinet 1a in FIG. 3, so that the user can easily operate these pushbuttons with his/her left thumb. The recording start pushbutton 61k which is also used frequently is formed larger than the other pushbuttons and arranged at the center of the main surface of the external cabinet 1a so that the user can easily operate this pushbutton with his/her left thumb. When one of these pushbuttons is operated, corresponding mechanical switch located below the depressed pushbutton is operated. At this time, a click sound is generated. The click sound will be detailed later.

The aforementioned microphone 11, the LCD panel 41 and the speaker 24 are also arranged on this main surface of the external cabinet 1a. Because the IC recorder is formed small so as to be convenient for carrying, the microphone 11 is located near the recording start button 61k.

The input device 60 includes: a hold switch 62; a record/reproduce lamp 63 which indicates recording or reproduction is in progress; a volume switch 64 for adjusting volume of the reproduced voice; and an earphone jack 65. As shown in FIG. 3, The record/reproduce lamp 63 is arranged on the main surface of the external cabinet 1a so that it can easily be seen while using. The hold switch 62, the volume switch 64, and the earphone jack 65 are used less frequently and arranged on the side portion of the external cabinet 1a. When the hold switch 62 is operated operation of the operation pushbuttons of the input device 60 is invalidated so as to prevent malfunction of the IC recorder while carrying.

Figure 4:
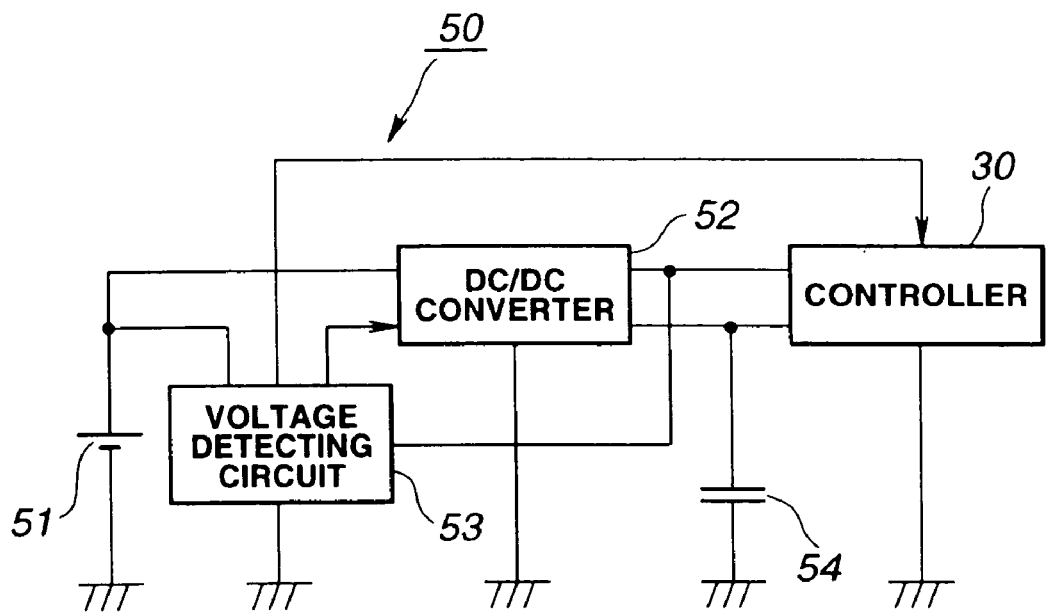
FIG. 4 is a block diagram showing a configuration of a power section of the IC recorder.

Subsequently, description will be directed to the power source section 50. For example, as shown in FIG. 4, the power source section includes: a battery 51; a DA/DA converter 52 for increasing an output voltage of the battery 51; a voltage detecting circuit 53 for detecting an output voltage of the battery 51; and a capacitor 54 for charging with an output voltage of the DC/DC converter 52.

As has been explained, the IC recorder 1 is for portable use and formed in size of a palm. Consequently, the battery 51 should also be small and is composed of a single cell of SUM-4 type. The output voltage of the battery 51, i.e., 1.5 volt is increased by the DC/DC converter 52 to a voltage required for operation of the amplifiers 12, 23, CPU 32 and others, and current of the resultant voltage is supplied to each of the circuits.

The voltage detecting circuit 53 detects an output voltage of the battery 51 and, when the output voltage of the battery 51 becomes, for example, 0.8 volt, terminates operation of the DC/DC converter. Electric power in the battery 51 will not be consumed after its output has reached a predetermined value, for example, 0.8 V. This prevents rapid decrease of the voltage of the battery 51 due to the DC/DC converter 52, thus preventing liquid leak of the battery 51.

The capacitor 54 is connected between the ground and a power cable which connects the DC/DC converter 52 with the timer 33 of the controller 30, and is charged by an output of the DC/DC converter 52. The timer 33 is operated with current supplied from this DC/DC converter 52 while the DC/DC converter 52 is operating; and with current from the capacitor 54 when the output voltage of the battery 51 is lowered or the DC/DC converter 52 is not operating when the battery 51 is taken out for replacement with a new one. That is, the capacitor, 54 is a so called back-up capacitor capable of, for example, about 3 minutes of back up.

Figure 5:
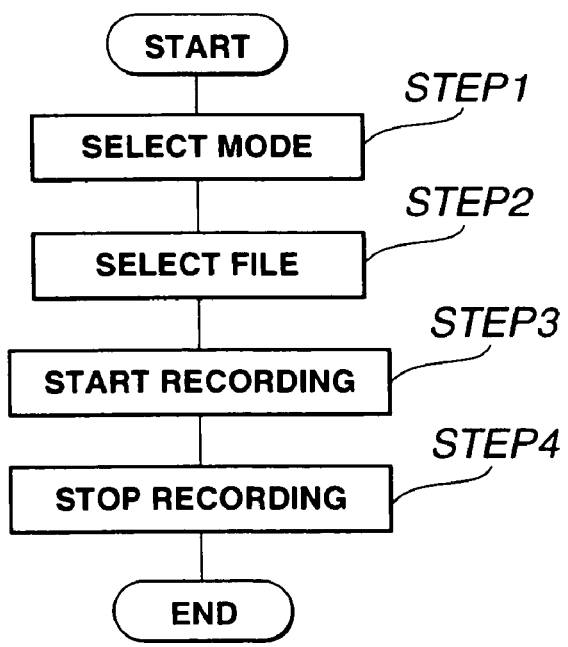
FIG. 5 is a flowchart showing a procedure of recording by the IC recorder.

In the IC recorder 1 of such a configuration, a recording is carried out according to a procedure, for example, as shown in FIG. 5. Firstly, the user depresses the SP/LP pushbutton 61f so as to select the LP mode or the SP mode as a recording method (step 1). The LCD panel 41 shows "SP" or "LS". Next, the user depresses the file select pushbutton 61d so as to select file A or file B provided in the semiconductor memory 9, and the selected file is indicated on the LCD panel 41(step 2).

When the recording start pushbutton 61k is depressed, a recording state starts in the IC recorder 1. When the user speaks toward the microphone section 11, a corresponding voice data is written in a specified area of the semiconductor memory 9 (step 3). When the stop pushbutton 61e is depressed, the IC recorder 1 releases the recording state (step 4). When the voice data is recorded in the semiconductor memory, the following are also recorded: TOC data, file number, index number which indicates the voice signal which is being recorded. When the user wishes to record another voice data immediately after the first recording operation, the voice data is recorded in the same mode and the same file area specified first, with an index number following the first index number. That is, step 1 of mode selection and step 2 of file selection can be omitted.

As has thus far been described, the IC recorder 1 starts recording when the recording start pushbutton 61k is depressed. Because the IC recorder 1 is of a small size and the microphone 11 is located near the recording start pushbutton 61k, it is necessary to prevent recording of a click sound generated when the recording start pushbutton 61k or the stop pushbutton 61e is depressed. For this, a voice data entered from the microphone 11 is temporarily stored in the buffer memory and then supplied to the semiconductor memory 9. This click sound is considered to be caused by changeover of a contact of a mechanical switch which is operated by the operation pushbutton arranged on the PC board of the IC recorder 1.

Figure 6:
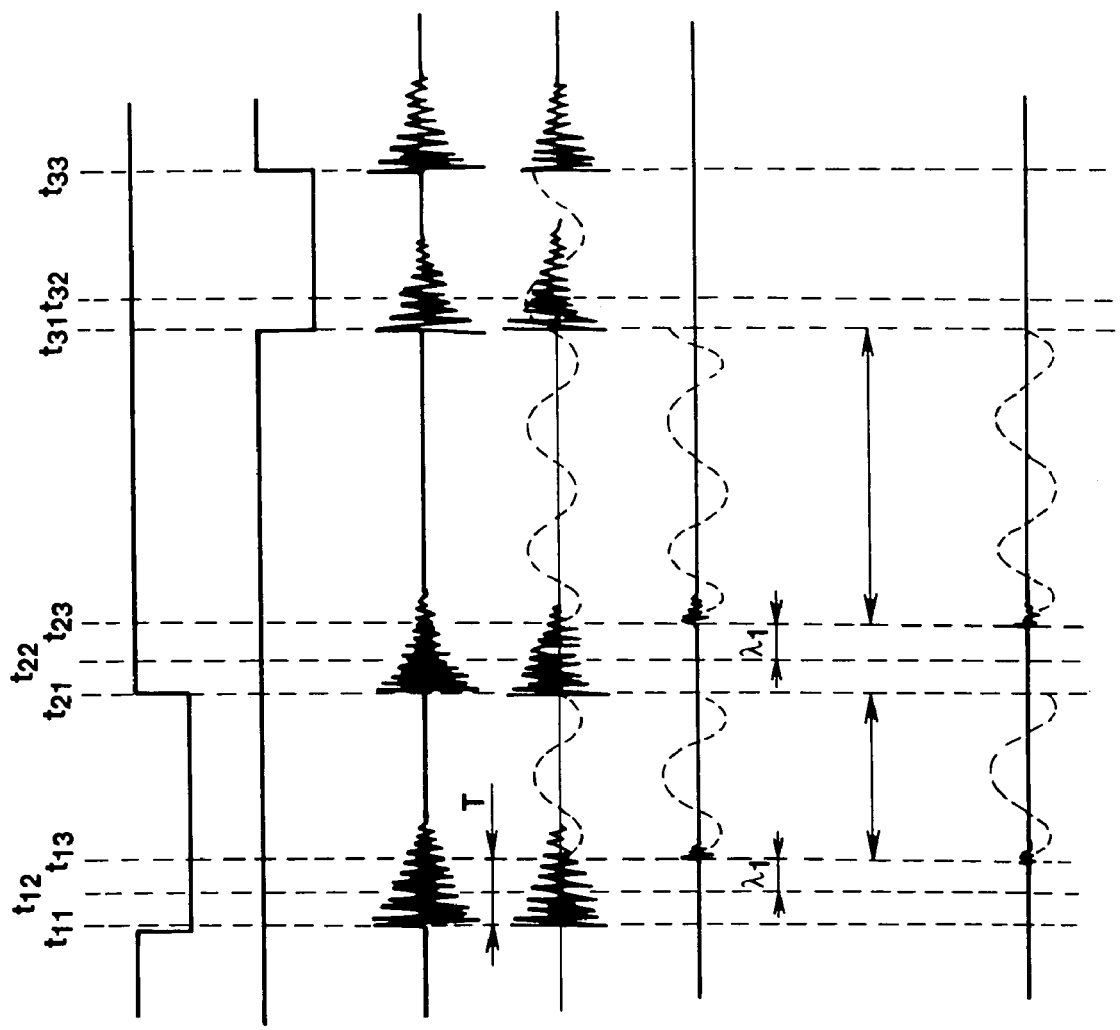
FIG. 6(A) to (G) are to be used to explain the relationship between a click voice generated by the recording start pushbutton or recording stop pushbutton, and a recording procedure.

For example, FIG. 6(A) shows that the recording start pushbutton 61k is depressed at time $t_{11}$ and released at time $t_{21}$, whereas FIG. 6(B) shows that the stop pushbutton 61e is depressed at time $t_{31}$ and released at time $t_{33}$, In this case, As shown in FIG. 6(C), a sound is generated having a maximum amplitude at times $t_{11}$, $t_{21}$, and $t_{31}$, and enduring for time T while attenuating its amplitude. Consequently, a sound to be recorded through the microphone 11 is overlapped with the click sound generated when the recording start pushbutton 61k or the stop pushbutton 61e is operated.

In the IC recorder according to the embodiment of the present invention, a click sound generated when the recording start pushbutton 61k or the stop button 61e is operated is not recorded because a voice data is supplied through the buffer memory 15 to the semiconductor memory 9. FIGS. 6(a) and (B) show that the recording start pushbutton 61k is operated at time $t_{11}$ i.e., the mechanical switch arranged below the pushbutton 61k is operated by a first half, and the fact that the recording start pushbutton 61k has been depressed is assured by the CPU 32 at time $t_{12}$. Then, read out of a voice data from the buffer memory 15 is started by a control signal from the CPU 32 at a time $t_{13}$ when a predetermined time λ1 has passed from time $t_{12}$. The voice data is written into the semiconductor memory 9 according to an address specified by the CPU 32, thus starting the recording operation. At this time, the voice data which is read out from the buffer memory 15 is a data which is read out from an address corresponding to a time after a laps of time from $t_{11}$ to $t_{13}$. The aforementioned predetermined time $\lambda 1$ is a time required for attenuation to an unhearable level of a click sound generated when an operation pushbutton such as a recording start pushbutton is depressed. As shown in FIG. 6(D), the microphone 11 outputs a signal containing a click sound generated when the recording start pushbutton 61k is depressed. However, as shown FIG. 6(E), the buffer memory 15 outputs a signal not containing a-component of the click sound which can be heard by the user. Consequently, there is no problem that the signal is written into the semiconductor memory 9 as it is. Whether or not the aforementioned predetermined time $\lambda 1$ has passed is counted by a timer function provided in the CPU 32 or by using the timer 33.

As shown in FIG. 6(C), the aforementioned click sound is also generated when the user has released the recording start pushbutton 61k, i.e., when the pushbutton 61 is restored. That is, at time $t_{21}$, user's finger leaves the recording start pushbutton 61k, i.e., the mechanical switch arranged below the pushbutton 61k is operated by the second half; and at time $t_{22}$, the fact that the finger has left the recording start pushbutton 61k is confirmed by the CPU 32. Then, the recording operation is temporarily stopped at a data corresponding to time $t_{21}$, and is re-started at time $t_{23}$ when the predetermined time $\lambda 1$ has passed from time $t_{22}$. When the fact that the user's finger has left the recording start pushbutton 61k is confirmed at time $t_{22}$, writing into the buffer memory 15 starts with a voice data from an address corresponding to time $t_{21}$, whereas read out starts with a voice data from an address corresponding to a moment when the predetermined time $\lambda 1$ has passed and the data is written into the semiconductor memory 9 at an address specified by the CPU 32. As a result, in the same way as the aforementioned click sound generated when the recording start pushbutton 61k is depressed, the buffer memory 15 outputs a voice data containing a component of the click sound which cannot be heard practically by the user. Thus, substantially no problem is caused. According to the present embodiment, the click sound generated by operation of the recording start pushbutton or the like has a length measured to be about 10 msec. Consequently, the aforementioned time required for reducing the noise generated by the click sound can be very short. Therefore, practically no problem is caused if the recording operation is interrupted as shown in FIG. 6(F).

The recording operation can be terminated by depressing the stop pushbutton 61e. The click sound is also generated twice when the stop pushbutton 61e is operated: as shown in FIG. 6(C), when the pushbutton 61e is depressed and when the pushbutton 61e is released. The stop pushbutton 61e is depressed at time $t_{31}$, i.e., the mechanical switch arranged below the pushbutton 61e is operated by the first half, and the fact that the stop pushbutton 61e has been depressed is confirmed by the CPU 32 at time $t_{32}$. Then, the recording operation is stopped with a data corresponding back to time $t_{31}$. The recording operation is terminated at a moment when a data in the buffer memory 15 at addresses corresponding to a time lapse between $t_{31}$ and $t_{32}$ has written into the semiconductor memory 9.

As has been described above, the voice data written in the semiconductor memory 9 actually contains a component of the click sound as shown in FIG. 6(G), but the click sound has been attenuated sufficiently to an unhearable level. Consequently, there is no practical problem when reproducing the voice data from the semiconductor memory 9.

It should be noted that the aforementioned predetermined time $\lambda 1$ is a time which passes while a click sound generated by operation of the recording start pushbutton 61k travels to the microphone 11. Consequently, its value is determined be a distance between the recording start button 61k and the microphone 11.

Figure 7:
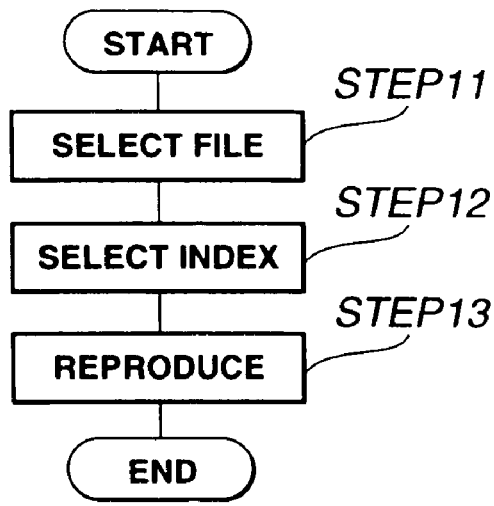
FIG. 7 is a flowchart showing a procedure of reproducing by the IC recorder.
Figure 8:
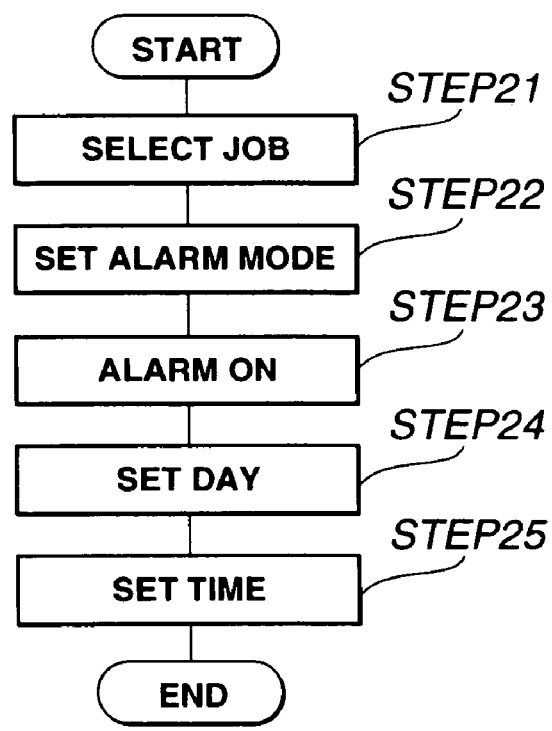
FIG. 8 is a flowchart showing a procedure of alarm reproduction by the IC recorder.

Description will now be directed reproduction of a voice data which has been recorded. The reproduction proceeds, for example, as shown in FIG. 7. Firstly, when the file select pushbutton 61d of the IC recorder 1 is depressed by a user, file "A" or "B" is selected in the semiconductor memory 9, and the one selected appears on the LCD panel 41 (step 11). Next, the user depress the return/feed pushbutton 61c so as to select an index number recorded in the semiconductor memory 9 (step 22). When the reproduce pushbutton 61b is depressed, the IC recorder reproduces the voice data desired by the user (step 13). In order to stop the reproduction, depress the stop pushbutton 61e. To proceed to another job or return back to a preceding job, confirm that no reproduction or recording is in progress and depress the return/feed pushbutton 61c so as to select the following or the preceding index number, data of which is reproduced when the reproduce pushbutton 61b is depressed.

Moreover, the controller 30 of the IC recorder 1 is provided with a crystal oscillator 35. By using this crystal oscillator 35 and the timer 33, a date and time are displayed on the LCD panel 41. The date and time can be set as follows. When the menu/feed pushbutton 61a is depressed, a date appears on the LCD panel and a date setting mode is set in. The IV recorder 1 can set a date by pressing the return/feed pushbutton 61c. When the menu/feed pushbutton 61a is depressed in this state, the mode is switched to a time setting mode, and the time appears on the LCD panel. The IV recorder 1 can set a time by depressing the return/feed pushbutton 61c. The IC recorder 1 terminates the time setting mode when the stop pushbutton 61e is depressed.

Furthermore, the IC recorder 1 is capable of so called alarm reproduction, i.e., reading out a voice data from the semiconductor memory 9 at a predetermined time which has been set by the timer 33. This alarm reproduction can be set, for example, as shown in FIG. 7. Firstly, in step 21, a user depresses the file select pushbutton 61d and the return/feed pushbutton 61c so as to select a file and index number to be read out. The necessary data is written in the RAM 34. Then, in step 22, the IV recorder 1 sets the alarm reproduction mode when the menu/feed pushbutton 61a is depressed. "ON" or "OFF" appears on the LCD panel. One of these is selected by depressing the return/feed pushbutton 61c. When "ON" is selected and the menu/feed pushbutton is further depressed as step 3, the alarm function enters ON state. The IC recorder 1 proceeds to step 24 when the menu/feed pushbutton 61a is depressed. In step 24, the user can select a desired day of the week by pressing the return/feed pushbutton 61c. If the return/feed pushbutton 61c is further depressed after selecting the day of the week, a day data concerning this day is written into the RAM 34, and the IC recorder proceeds to step 25. In step 25, the user can select a desired time by pressing the return/feed pushbutton 61c. When the user depresses the stop pushbutton 61e, the IC recorder writes a day data concerning this day into the RAM 34, terminating the alarm reproduction mode setting. In the IC recorder 1 in which the alarm reproduction mode has been set in, when the timer 33 count the same time as the alarm setting, the CPU 32 reads out the data which has been written in the RAM 34, i.e., file data, index number, day data and time data to be executed. Thus, the voice data corresponding to the RAM 34 is read from the semiconductor memory 9 for reproduction.

The IC recorder 1 having the aforementioned configuration enables a user to store an aural memorandum as a voice data instead of writing the memorandum on paper. The IC recorder 1, by using the buffer memory 15, makes it possible that a reproduced data is not affected by a noise due to a click sound generated by depressing operation pushbuttons at recording start and stop. The IC recorder I is capable of reproducing a voice data at a predetermined time by setting the timer 33. For example, the IC recorder 1 can prevent the user from forgetting something which is reproduced as a voice data at a necessary moment. Because the IC recorder 1 is of a small size and can be placed in a user's pocket, the user can carry it any time anywhere. Moreover, because a data can be reproduced at a specified time, i.e., alarm reproduction time, the user will not miss a necessary memorandum.

The present invention thus far explained as an example of voice recording and/or reproducing apparatus having a semiconductor memory as a recording medium is not limited to this, but is also applicable to recording and/or reproducing apparatus for recording image data instead of voice data or to a voice recording/reproducing apparatus using a tape or disc as a recording medium and having a microphone built in an external cabinet. The IC recorder which employs two separate pushbutton switches for a recording start pushbutton and a stop pushbutton can also be realized as an IC recorder having a single pushbutton switch for both of the recording-start and stop pushbuttons.

What is claimed is:

1. A recording and/or reproducing apparatus comprising:
    a microphone;
    an automatic gain control circuit for adjusting an output signal from said microphone;
    an analog to digital converting circuit for converting an output signal from said microphone into a digital output signal;
    a semiconductor memory for storing said digital output signal from said analog to digital converting circuit;
    a digital to analog converting circuit for converting a digital signal read from said semiconductor memory into an analog output signal;
    an input device operable by a user of said apparatus for entering at least a recording start mode;
    a controller for controlling in response to an input from said input device a writing of said digital output signal from said analog to digital converting circuit into said semiconductor memory and a reading of a stored digital signal from said semiconductor memory; and
    a cabinet in which said microphone, said analog/digital converting circuit, said digital/analog converting circuit, and said input device are arranged,
    wherein said semiconductor memory includes at least two files and said output signal from said microphone converted by said analog to digital converting circuit into said digital output signal is written in one of said at least two files file as specified by said input device,
    said controller controls a start of said writing of said digital converting circuit into said semiconductor memory in response to an input from said input device, and
    after said input device is operated and a predetermined time interval has lapsed said controller controls the start of said writing into said semiconductor memory of said digital output signal from said analog to digital converting circuit, and wherein
    said controller comprises a switch for entering a recording start mode; and
    said controller starts writing into said storage device when said predeterming time interval has passed after said switch is initially operated, and terminates writing into said storage device said digital output signal from said analog to digital converting circuit at a time point equal to said predetermined interval before an end of said digital output signal occurs after said switch is subsequently operated.

* * * * *

UNITED STATES PATENT AND TRADEMARK OFFICE
CERTIFICATE OF CORRECTION

| | | |
|---|---|---|
| PATENT NO. | : 7,574,275 B2 | Page 1 of 1 |
| APPLICATION NO. | : 11/092940 | |
| DATED | : August 11, 2009 | |
| INVENTOR(S) | : Eiichi Yamada | |

It is certified that error appears in the above-identified patent and that said Letters Patent is hereby corrected as shown below:

On the Title page, Item (*) Notice, please add reference to the Terminal Disclaimer filed.

Signed and Sealed this
Twenty-ninth Day of March, 2011

David J. Kappos
*Director of the United States Patent and Trademark Office*